(12) United States Patent
Abdali Mashhadi et al.

(10) Patent No.: US 12,352,801 B2
(45) Date of Patent: Jul. 8, 2025

(54) WAFER TESTING FOR CURRENT PROPERTY OF A POWER TRANSISTOR

(71) Applicant: Infineon Technologies Canada Inc., Ottawa (CA)

(72) Inventors: Iman Abdali Mashhadi, Kanata (CA); Thomas William MacElwee, Nepean (CA); Mohammad Bozorgi, Kanata (CA); Ting-Hsiang Hsu, Hsinchu (TW); Meng-ta You, Hsinchu (TW); Regina Inyangat Akudo, Kanata (CA); Yueh Lin Chiang, Ottawa (CA)

(73) Assignee: Infineon Technologies Canada Inc., Ottawa (CA)

( * ) Notice: Subject to any disclaimer, the term of this patent is extended or adjusted under 35 U.S.C. 154(b) by 190 days.

(21) Appl. No.: 18/349,780

(22) Filed: Jul. 10, 2023

(65) Prior Publication Data
US 2025/0020712 A1 Jan. 16, 2025

(51) Int. Cl.
*G01R 31/26* (2020.01)
(52) U.S. Cl.
CPC ..... *G01R 31/2621* (2013.01); *G01R 31/2601* (2013.01); *G01R 31/2644* (2013.01)
(58) Field of Classification Search
CPC ............ G01R 31/2621; G01R 31/2601; G01R 31/2644; G01R 31/2642; H01L 22/14
USPC ........................ 324/762.09, 762.01, 537, 500
See application file for complete search history.

(56) References Cited

U.S. PATENT DOCUMENTS

| | | | |
|---|---|---|---|
| 2017/0059645 A1* | 3/2017 | Pan | G01R 31/2607 |
| 2019/0064251 A1* | 2/2019 | Yoshida | G01R 31/2621 |
| 2020/0400738 A1* | 12/2020 | Akin | G01R 31/2621 |
| 2023/0069188 A1 | 3/2023 | Shoji et al. | |

FOREIGN PATENT DOCUMENTS

WO 2021244713 A1 12/2021

OTHER PUBLICATIONS

European Search Report Received for application No. 24186183. 0-1001 Dec. 12, 2024, 7 Pages.

\* cited by examiner

*Primary Examiner* — Giovanni Astacio-Oquendo
(74) *Attorney, Agent, or Firm* — WORKMAN NYDEGGER

(57) ABSTRACT

Wafer testing of a power transistor for a current property of the power transistor. Wafer testing of a power transistor is performed by using a sense transistor constructed using the same epitaxial stack as was used to construct the power transistor. The current property of the sense transistor is then measured, and the current property of the power transistor can be determined from that measurement. Furthermore, the sense transistor is pre-conditioned prior to the measurement by alternately turning on and off the sense transistor multiple cycles while allowing a source terminal of the power transistor to float. This simulates operating conditions of the power transistor, thereby allowing for measurement of the current property of the power transistor as it would likely be in operation.

17 Claims, 7 Drawing Sheets

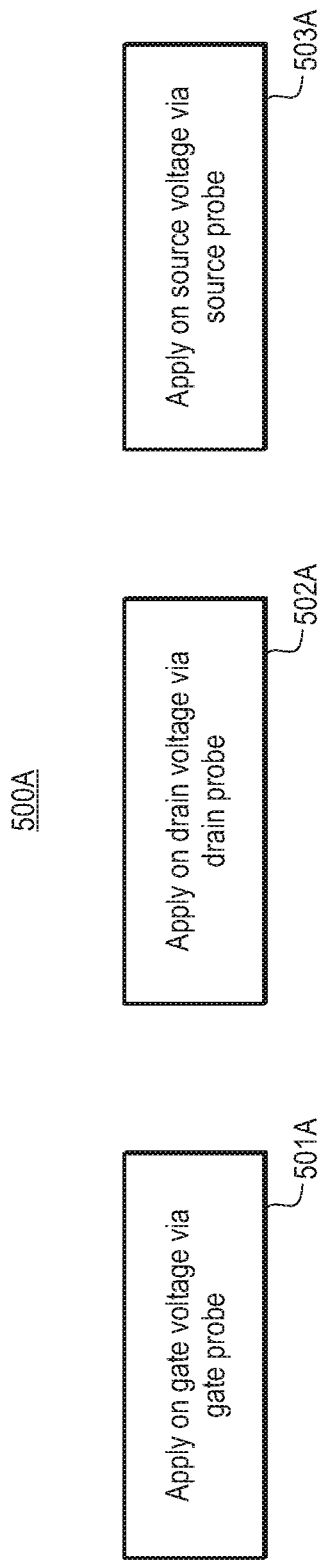
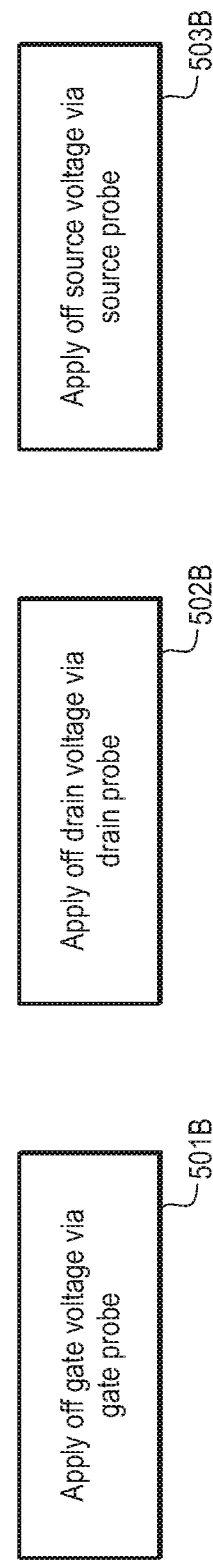
*FIG. 5A*
*FIG. 5B*

WAFER TESTING FOR CURRENT PROPERTY OF A POWER TRANSISTOR

BACKGROUND

Integrated electrical circuits are typically fabricated on a wafer, where each integrated circuit is fabricated within a particular area (a particular "die") of the wafer. For example, a typical wafer is composed of crystalline silicon. The integrated electrical circuits are fabricated by various semiconductor processing steps that include, for example, epitaxial layer deposition, photolithographic patterning, etching, planarization, alignment, and so forth. During the fabrication, the wafer is moved from machine to machine often undergoing hundreds of distinct semiconductor processing steps. After the integrated circuits have been fully fabricated, the wafer is diced such that each integrated circuit is separated in its own die.

The testing of each die may be performed before or after the integrated circuit is diced. When testing is performed prior to dicing, the testing is performed on the wafer directly, and is termed "wafer testing". Wafer testing is performed by using probes to apply signals and/or voltages to particular points in the integrated circuit and by receiving resulting signals and/or voltages from particular points in the integrated circuit. The integrated circuit typically has small feature dimensions. Accordingly, the wafer probes are typically very fine so that they can make appropriate contact with distinct points in the integrated circuit. In fact, the probes are often appropriately referred to as "probe needles" or "needles". In any case, those die that failed testing may be identified for discarding. Those die that passed testing may be later packaged.

Integrated electrical circuits typically include transistors, which function as electronic switches that regulate or control current flow in portions of the circuit. One type of transistor is a field-effect transistor in which a voltage is applied to a gate terminal to turn the transistor on and off. A semiconductor channel region is disposed between the drain terminal and the source terminal. When the transistor is on, current flows through the semiconductor channel region between the source terminal and the drain terminal. When the transistor is off, lesser or no current flows through the semiconductor channel region between the source terminal and the drain terminal. The gate terminal is disposed over the semiconductor channel region between the source terminal and the drain terminal. Voltage on the gate terminal generates a field that affects whether the semiconductor channel region conducts current hence the term "field-effect transistor".

Nevertheless, there are other types of transistors. In each transistor, current flows from an input node to an output node through a channel when the transistor is turned on by applying a sufficient voltage to a control node. For instance, in a field-effect transistor, the control node would be the gate terminal, the input node would be one of the source or drain terminals, and the output node would be the other of the source or drain terminals.

Typical transistors are used for amplifying and switching purposes in electronic circuits. On the other hand, power transistors are used to convey more substantial current, have higher voltage ratings, and may more typically be used in power supplies, battery charging, and the like. Power transistors can typically operate with currents greater than 1 amp to as much as a hundred amps or even greater. Power transistors may convey power greater than 1 watt to as many as hundreds of watts or even greater.

The subject matter claimed herein is not limited to embodiments that solve any disadvantages or that operate only in environments such as those described above. Rather, this background is only provided to illustrate one example technology area where some embodiments described herein may be practiced.

BRIEF SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Embodiments described herein relate to the wafer testing of a power transistor for a current property of the power transistor. Power transistors are capable of transferring significant amounts of power. Accordingly, wafer testing of power transistors for a current property is difficult because the fine probe needles are not themselves capable of carrying significant amounts of power. In accordance with the principles described herein, wafer testing of a power transistor is performed by using a sense transistor constructed using the same epitaxial stack as was used to construct the power transistor. The current property of the sense transistor is then measured, and the current property of the power transistor can be determined from that measurement.

Furthermore, the sense transistor is pre-conditioned prior to the measurement by alternately turning on and off the sense transistor multiple cycles while allowing a source terminal of the power transistor to float. This simulates operating conditions of the power transistor, thereby allowing for measurement of the current property of the power transistor as it would likely be in operation. This testing occurs all while the power transistor is still on the wafer prior to dicing of the wafer into individual die. In one embodiment, the wafer is also heated to more closely match an expected operating temperature that the power transistor would experience in operation. This even further simulates operating conditions of the power transistor, thereby even further improving the measurement of the current property of the power transistor.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the advantages and features of the embodiments described herein can be obtained, a more particular description of the concepts briefly described above will be rendered by reference to specific embodiments thereof which are illustrated in the appended drawings. Understanding that these drawings depict only example embodiments, and are not therefore to be considered to be limiting of the scope of the invention, certain embodiments will be described and explained with additional specificity and detail through the use of the accompanying drawings in which:

FIG. 5A illustrates acts of a method for turning on the sense transistor;

FIG. 5B illustrates acts of a method for turning off the sense transistor;

DETAILED DESCRIPTION

Embodiments described herein relate to the wafer testing of a power transistor for a current property of the power transistor. Power transistors are capable of transferring significant amounts of power. Accordingly, wafer testing of power transistors for a current property is difficult because the fine probe needles are not themselves capable of carrying significant amounts of power. In accordance with the principles described herein, wafer testing of a power transistor is performed by using a sense transistor constructed using the same epitaxial stack as was used to construct the power transistor. The current property of the sense transistor is then measured, and the current property of the power transistor can be determined from that measurement.

Furthermore, the sense transistor is pre-conditioned prior to the measurement by alternately turning on and off the sense transistor multiple cycles while allowing a source terminal of the power transistor to float. This simulates operating conditions of the power transistor, thereby allowing for measurement of the current property of the power transistor as it would likely be in operation. This testing occurs all while the power transistor is still on the wafer prior to dicing of the wafer into individual die. In one embodiment, the wafer is also heated to more closely match an expected operating temperature that the power transistor would experience in operation. This even further simulates operating conditions of the power transistor, thereby even further improving the measurement of the current property of the power transistor.

Figure 1:
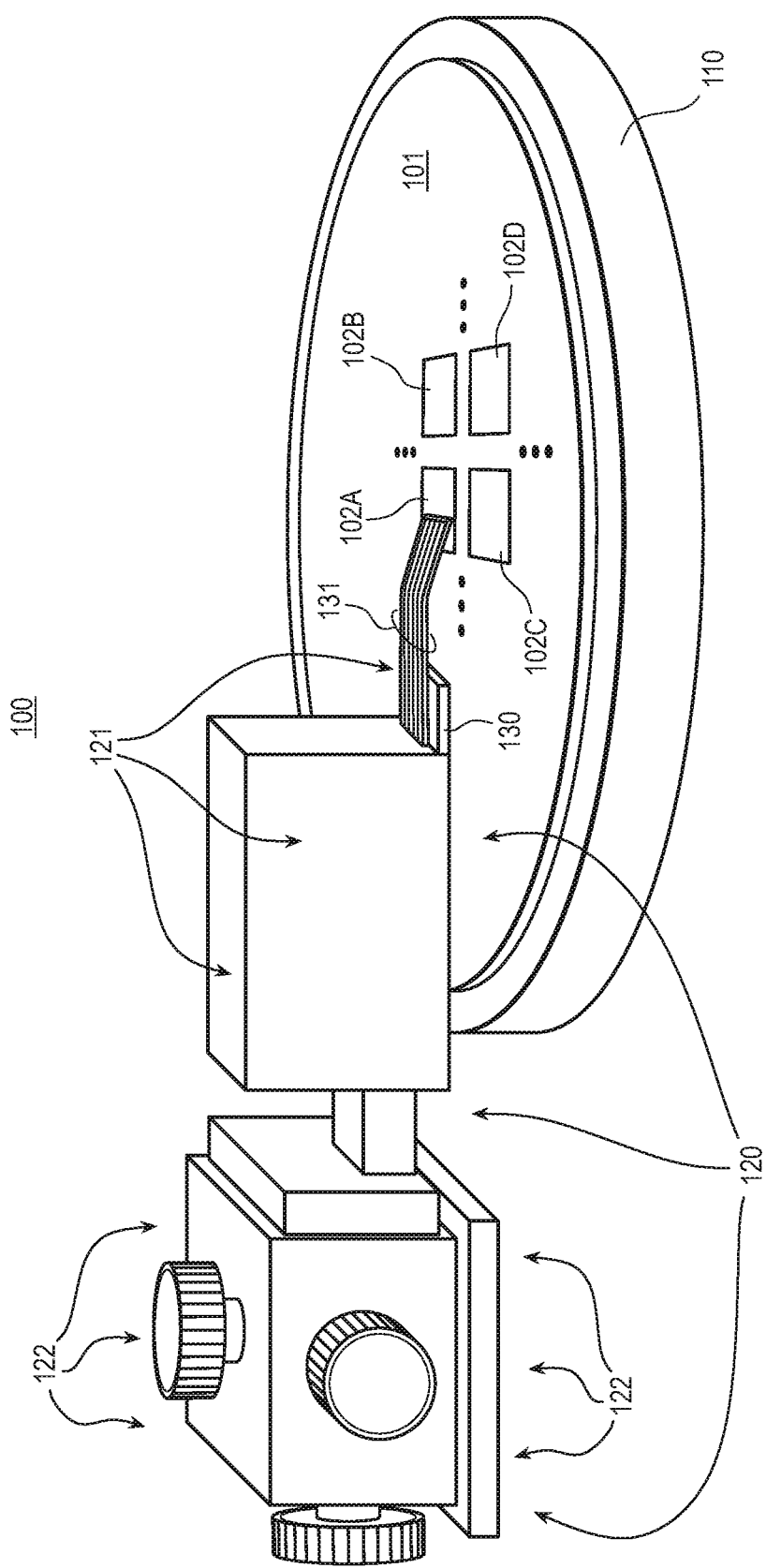
FIG. 1 illustrates a wafer testing environment in which the principles described herein may be practiced, and which includes a wafer probe apparatus that uses probes to contact and test a wafer that is situated on a wafer chuck.

FIG. 1 illustrates a wafer testing environment 100 in which the principles described herein may be practice. The wafer testing environment 100 is however just an example of a wafer testing environment in which the principles described herein may be practiced. The wafer testing environment 100 includes a wafer 101. The wafer 101 includes multiple die formed thereon, but only die 102A, 102B, 102C and 102D are illustrated in FIG. 1. The ellipses represent that there may be any number of die on the wafer 101 limited only by the size of the die and the size of the wafer. Each die includes corresponding circuitry formed by applying semiconductor processing steps to the wafer. The principles described herein are not restricted to what those semiconductor processing steps are. After the semiconductor processing is complete, and the circuitry fully formed, the wafer is diced to thereby physically separate each die. However, FIG. 1 illustrates the wafer prior to dicing. "Wafer testing" refers to the testing of the circuitry formed on the wafer, and in which the testing is performed prior to dicing of the wafer.

The purpose of the wafer testing environment 100 is to apply probes to the circuitry formed on the wafer 101 to verify operation of the circuitry prior to dicing of the wafer. For example, in FIG. 1, the wafer probes are contacting die 102A to test whether the circuitry formed on the die 102A operate properly. In accordance with the principles described herein, the die 102A includes a power transistor. In this description and in the claims, a "power transistor" is any transistor capable of transferring more than one watt of power when on.

The wafer 101 is supported by a wafer chuck 110 that may be, for example, a thermal chuck configured to heat the wafer 101 to a particular temperature during wafer testing. In one example, the wafer chuck 110 heats the wafer 101 up to the approximate temperature that the die under test might be expected to encounter during operation (e.g., 100 degrees Celsius). The principles described herein are not limited to the particular structure of the wafer chuck 110, nor to whether the wafer chuck heats the wafer 101.

The wafer testing environment 100 also includes a wafer probe apparatus 120 that includes a mobile portion 121 and a position adjustment portion 122 that permits movement of the mobile portion 121 in three-dimensions. A probe card 130 extends from the mobile portion 121 and has a probe set 131 that extends from the probe card 130. The probe set 131 may be positioned so that each of one or more of the probes contact particular respective points on the wafer 101. The principles described herein are not limited to the particular structure of the wafer probe apparatus 120. Suffice it to say that the probes of the probe set 131 are very fine (thus being called "probe needles" or "needle probes") and are thus not capable of carrying significant power.

In FIG. 1, the probe set 131 is making contact with die 102A. For purposes of discussion, the die 102A will be described as forming a power transistor and a sense transistor, where a current property of the sense transistor is measured to determine a current property of the power transistor. In accordance with the principles described herein, a current property of the power transistor may be determined using the probe set 131 notwithstanding each probe of the probe set 131 is too fine to carry significant electrical power. In accordance with one aspect described herein, the probe set 131 measures a current property of the sense transistor, so that the current property of the power transistor may then be measured based on the current property of the sense transistor.

Figure 2:
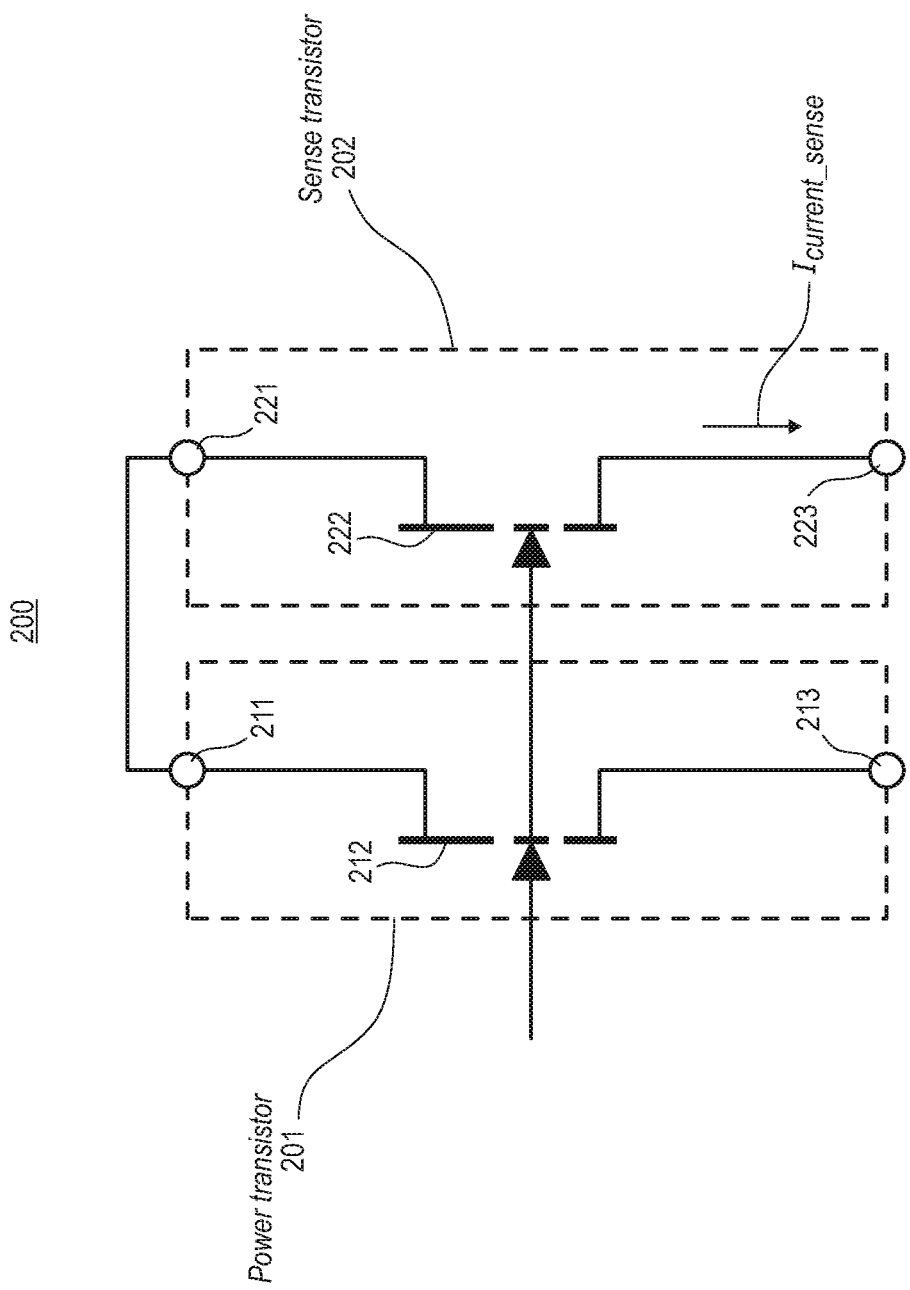
FIG. 2 illustrates a circuit that includes a power transistor and a sense transistor, in which a current property of the sense transistor is measured to determine a current property of the power transistor, in accordance with the principles described herein.

FIG. 2 illustrates a circuit 200 that includes a power transistor 201 and a sense transistor 202, and in which a current property of the sense transistor 202 is measured to determine a current property of the power transistor 201, in accordance with the principles described herein. As an example, the circuit 200 may be fabricated on the die 102A of FIG. 1, and may be subjected to testing using the wafer probe apparatus 120. An active region of the sense transistor 202 may be constructed using at least part of the same epitaxial stack as the was used to construct the active region of the power transistor 201. Accordingly, electrical behavior of the sense transistor 202 may closely mirror in proportionate fashion the electrical behavior of the power transistor 201.

As an example, the power transistor 201 and the sense transistor 202 may have a Gallium Nitride (GaN) channel layer that is formed out of the same epitaxial layer originally epitaxially deposited on the die 102A. In that case, the power transistor 201 and the sense transistor 202 may have an Aluminum Gallium Nitride (AlGaN) barrier layer that is formed out of the same epitaxial layer originally epitaxially deposited over the GaN layer on the die 102A.

That said, a current flow area of the current sense transistor 202 may be much smaller than the current flow area of the power transistor 201. In this description and in the claims, a "current flow area" of a transistor is a cross-sectional area through which current flows when the transistor is on. For instance, presuming a constant range of depth for the current flow, the current flow area would be proportional to the current flow width (e.g., the gate width).

In one embodiment, the current sense transistor 202 is small enough that the power transistor 201 has a current flow area that is at least 100 times (or even at least 1000 times) the current flow area of the sense transistor 202. In one embodiment, the current flow area of the power transistor 201 is about 7000 times the current flow area of the sense transistor 202. Thus, the sense transistor 202 may be very minute, but otherwise proportionately mirror the electrical characteristics of the power transistor 201. As an example, by measuring the saturation current of the sense transistor 202 and multiplying that measured saturation current by the size ratio (e.g., 7000), one may determine the saturation current of the power transistor 201.

Furthermore, the drain terminal 211 of the power transistor 201 is connected to the drain terminal 221 of the power transistor 202, and the gate terminal 212 of the power transistor 201 is connected to the drain terminal 222 of the sense transistor 202. Furthermore, during wafer testing of the circuit 200, the source terminal 213 of the power transistor 201 is allowed to float, but a voltage (e.g., ground) is applied to the source terminal 223 of the sense transistor 202. Accordingly, the same terminals that are used to operate the power transistor 201 may be used to test the sense transistor 202. The only difference is that instead of applying the source voltage to the source terminal 213 of the power transistor 201 as would occur during operation, the source voltage is instead applied to the source terminal 223 of the sense transistor 202 as the source terminal 213 of the power transistor 201 is allowed to float.

Figure 3:
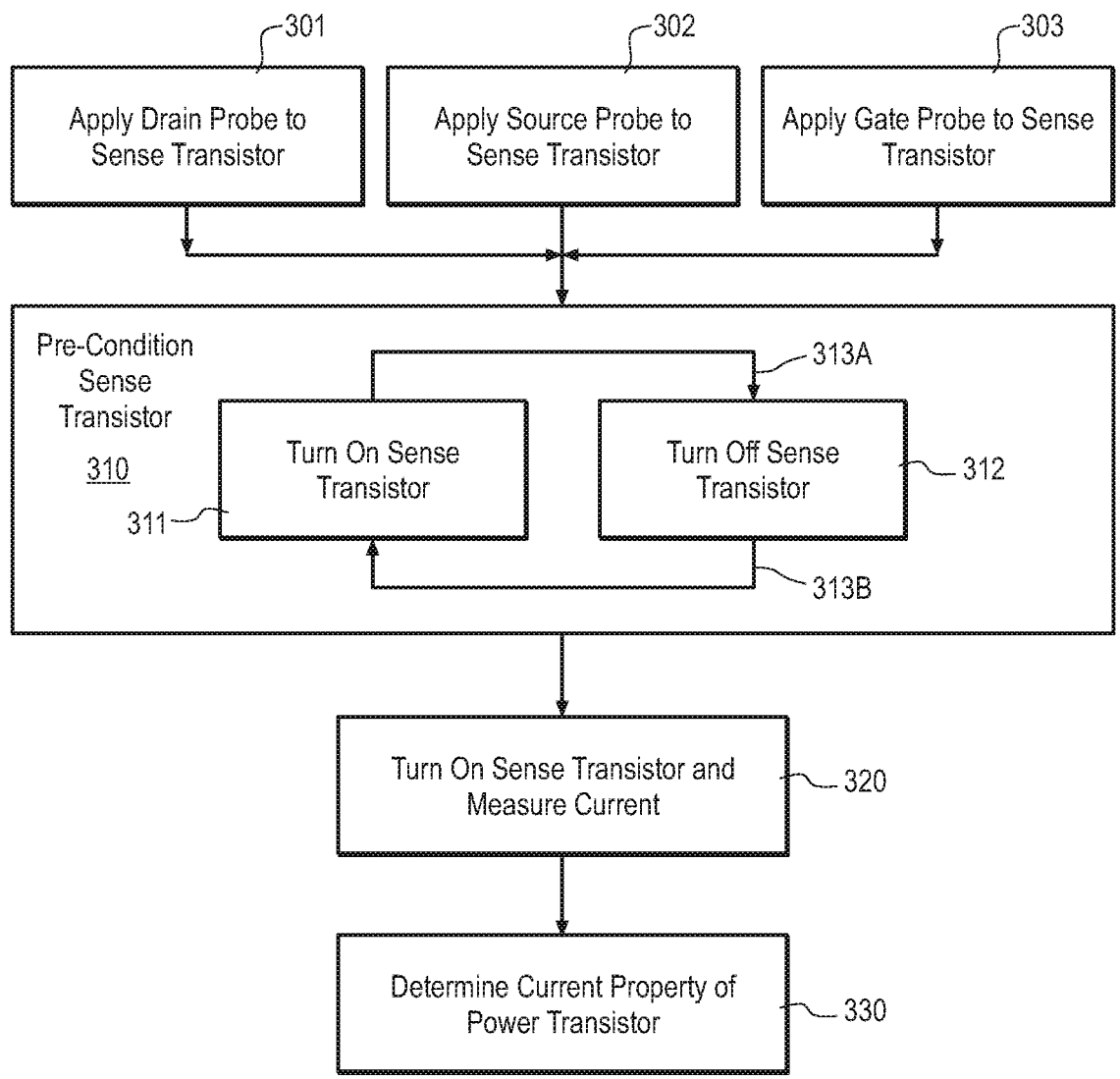
FIG. 3 illustrates a flowchart of a method for determining a current property of a power transistor while the power transistor is still on a wafer, in accordance with the principles described herein, and which may be applied to the circuit of FIG. 2 in the wafer testing environment of FIG. 1.

FIG. 3 illustrates a flowchart of a method 300 for determining a current property of a power transistor while the power transistor is still on a wafer, in accordance with the principles described herein. The method 300 first includes applying probes to the drain terminal, source terminal, and gate terminal of the sense transistor. For instance, a first probe (called herein also a "drain" probe) is applied to the drain terminal of the sense transistor (act 301), a second probe (called herein a "source probe") is applied to the source terminal of the sense transistor (act 302), and a third probe (called herein a "gate probe") is applied to the gate terminal of the sense transistor (act 303). These acts 301, 302, and 303 are shown in parallel to merely represent that the principles described herein are not limited to the timing on when the probes are applied.

If the method 300 of FIG. 3 is performed on the circuit 200 of FIG. 2, the applying of the drain probe (act 301) may be accomplished by applying the drain probe to the drain terminal 221 of the sense transistor 202. Furthermore, the applying of the source probe (act 302) may be accomplished by applying the source probe to the source terminal 223 of the sense transistor 202. Also, the applying of the gate probe (act 303) may be accomplished by applying the gate probe to the gate terminal 222 of the sense transistor 202. If the circuit 200 were on the die 102A of the wafer 101 of FIG. 1, the applying of these probes may be accomplished by using the position adjustment portion 122 to move the probe set 131 in three dimensional space so that the appropriate probes contact the appropriate terminals of the sense transistor formed on the die 102A.

After the probes have been appropriately placed (in acts 301, 302 and 303), the sense transistor is then pre-conditioned (act 310). This is performed by alternately turning on the sense transistor (act 311), and turning off the sense transistor (312) through multiple on-off cycles while the source terminal of the power transistor is permitted to float. The arrows 313A and 313B represented the repeated turning on and off of the sense transistor. For instance, in FIG. 2, the sense transistor 202 is pre-conditioned by repeatedly turning the sense transistor 202 on and off.

Each on-off cycle may be performed relatively quickly, perhaps even at a rate greater than 10,000 times per second. Thus, if the pre-conditioning involves 100 on-off cycles, then the pre-conditioning would only take a small fraction of a second. In one embodiment, the number of on-off cycles is at least 20 cycles. However, 100 on-off cycles would provide an even greater amount of pre-conditioning. The cycling of the sense transistor (e.g., sense transistor 202) does help the sense transistor to assume similar current performance (but scaled down) as the power transistor (e.g., power transistor 201) would experience during actual operating conditions of the power transistor. Specifically, the sense transistor 202 is forced to have similar charge trapping as would be encountered by the power transistor 201 during normal operating conditions. Such charge trapping does impact the current behaviors of the transistor. Thus, forcing the sense transistor 202 to encounter charge trapping would result in the sense transistor 202 being an accurate scaled-down proxy for determining the current property of the power transistor 201 during normal operation.

In the context of the pre-conditioning, the terms "on gate voltage" and "off gate voltage" will be used. This "on gate voltage" may be a predetermined voltage (e.g., such as six volts) that will cause the sense transistor to form a conductive path from the drain terminal to the source terminal if the on gate voltage is applied for long enough. This contrast with an "off gate voltage" which is a lower predetermined voltage (e.g., zero volts) that will cause the sense transistor to disconnect the drain terminal from the source terminal if the off gate voltage is applied for long enough. The cycling of the sense transistor is accomplished by applying alternately the on gate voltage and the off gate voltage very quickly via the gate probe. For instance, in FIG. 2, the on gate voltage and off gate voltage are quickly alternately applied via the gate probe to the gate terminal 222 of the sense transistor.

However, it takes some time for the sense transistor to turn on, and turn off. For instance, in the context of FIG. 2, when the sense transistor 202 is turned on and off quickly, turning on the sense transistor 202 will cause the resistance between the drain terminal 221 and source terminal 223 to reduce at a certain rate causing the current passing through the sense transistor 202 to increase at a certain rate. Likewise, when the sense transistor 202 is turned on and off quickly, the turning off of the sense transistor 202 will cause the resistance between the drain terminal 221 and source terminal 223 to increase at a certain rate causing the current passing through the sense transistor 202 to decrease at a certain rate. Thus, in the pre-conditioning stage, there is always some current passing through the sense transistor 202 regardless of whether the sense transistor 202 is turned on or off, at least in the case where the on-off cycling occurs very quickly. This rapid turning on and off of the sense transistor 202 causes charge trapping to occur in the sense transistor 202, simulating charge trapping that would occur in the power transistor 201 during normal operation. Thus, in the context of FIG. 2, the pre-conditioning of the sense transistor 202 would cause the sense transistor 202 to have similar electrical properties (but at a smaller scale) as the power transistor 201 would experience in later operation.

Figure 4:
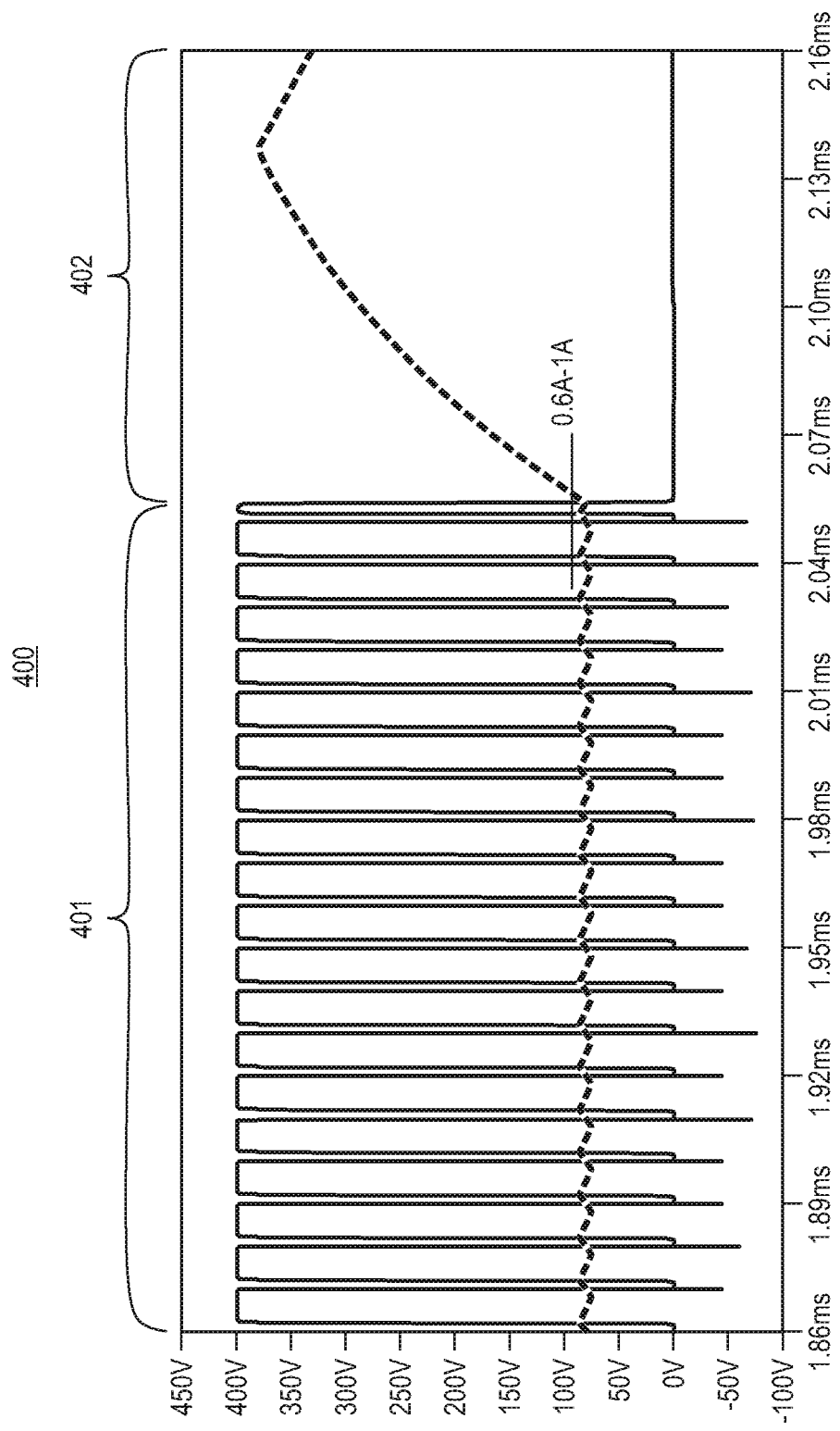
FIG. 4 illustrates a signal diagram showing a simulation of two waveforms representing signals encountered by a sense transistor, the solid waveform representing a simulated drain-to-source voltage of the sense transistor, and the dotted waveform representing a simulated current through the sense transistor.

FIG. 4 illustrates a signal diagram 400 showing a simulation of two waveforms. The solid waveform represents simulated a drain-to-source voltage of the sense transistor. However, the dotted waveform represents simulated current through the sense transistor. As an example, the simulated current may be the current $I_{current\_sense}$ in FIG. 2. The timeframe of the signal diagram 400 is labelled from time 1.86 ms to time 2.16 ms. The timeframe 401 corresponds to the time at which pre-conditioning occurs. The timeframe 401 shows the final twenty or so on-off cycles of the pre-conditioning phase of the sense transistor. When the sense transistor is on, the drain-to-source voltage drops and the current increases. However, the on time is not long, and so the current increase is slight. When the sense transistor is off, the drain-to-source voltage increases and the current decreases. However, the off time is not long, and so the current decrease is slight. However, there is some current flowing through the sense transistor during the pre-conditioning process. Since there is current when the sense transistor is switched, this is hard switching, which induces charge trapping in the sense transistor.

In addition to the terms "on gate voltage" and "off gate voltage", the terms "on drain voltage" and "off drain voltage" will also be used herein. The "on drain voltage" is the voltage applied to the drain terminal of the sense transistor when the sense transistor is on, and the "off drain voltage" is the voltage applied to the drain terminal of the sense transistor when the sense transistor is off. Similarly, the "on source" voltage is the voltage applied to the source terminal of the sense transistor when the sense transistor is on, and the "off source voltage" is the voltage applied to the source terminal of the sense transistor when the sense transistor is off. However, in one embodiment, the on source voltage and the off source voltage are the same, and may be ground.

Thus, referring to FIG. 2, the voltage applied through the source probe to the source terminal 223 of the sense transistor 202 may simply be ground. In this case, referring to FIG. 4, the off drain voltage is about 400 volts since the drain-to-source voltage is shown as about 400 volts when the sense transistor is off. On the other hand, the on drain voltage is close to zero (in the low single digits of volts) when the sense transistor is on. Thus, referring to FIG. 4, when the sense transistor is on, the drain-to-source voltage is shown as being substantially zero volts. Thus, in the pre-conditioning phase 401, the drain-to-source voltage oscillates with the turning on and off of the sense transistor.

FIG. 5A illustrates a flowchart of a method 500A for turning on the sense transistor. The method 500A includes applying an on gate voltage via the gate probe to the gate terminal of the sense transistor (act 501A) whilst applying an on drain voltage via the drain probe to the drain terminal of the sense transistor (act 502A), and whilst applying an on source voltage via the source probe to the source terminal of the sense transistor (act 503A). Similarly, FIG. 5B illustrates a flowchart of a method 500B for turning off the sense transistor. The method 500B includes applying an off gate voltage via the gate probe to the gate terminal of the sense transistor (act 501B) whilst applying an off drain voltage via the drain probe to the drain terminal of the sense transistor (act 502B), and whilst applying an "off source voltage" via the source probe to the source terminal of the sense transistor (act 503B). As previously mentioned, the on source voltage and the off source voltage may be the same, and may be ground. Furthermore, the on gate voltage may be predetermined and be the voltage at which the sense transistor is designed to turn on, and the off gate voltage may also be predetermined and be the voltage at which the sense transistor is designed to be turned off.

Returning to the method 300 of FIG. 3, after pre-conditioning the sense transistor (act 310), the sense transistor is turned on and the electrical characteristics of the sense transistor are measured (act 320). The measuring may include the measuring of one or both of 1) the current passing through the sense transistor from the drain terminal of the sense transistor to the source terminal of the sense transistor as the current increases, and 2) a drain-source voltage between the drain terminal of the sense transistor and the source terminal of the sense transistor as the drain-source voltage increases.

For instance, in FIG. 4, during timeframe 402, the sense transistor is turned on and allowed to stay on for a more significant period of time, which causes the current passing through the sense transistor to increase. The current passing through the sense transistor is permitted to increase such that various properties of the current may be determined. For instance, the following current properties may be determined: a current at which the current exits a linear region by a particular amount, or a saturation current. These properties may also be observed by measuring the drain-source voltage. For instance, the drain-to-source voltage may begin increasing when the current exits the linear region, and may increase at a rapid rate when the current enters saturation. Alternatively, or in addition, a current property may be determined in the form of a current slope versus time.

Figure 6:
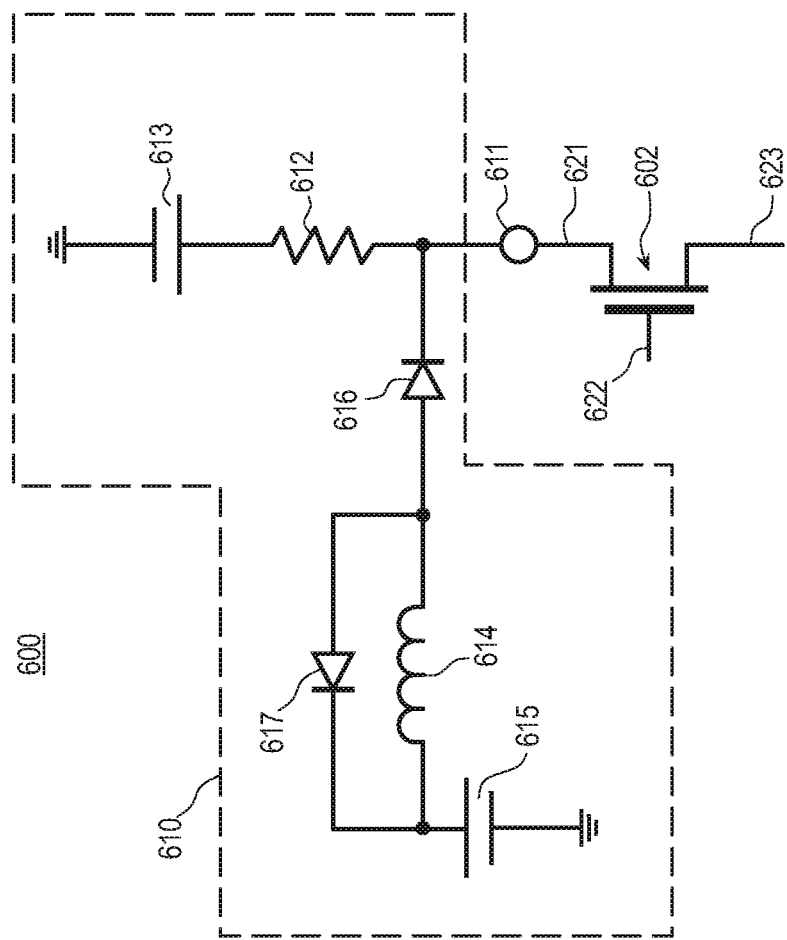
FIG. 6 illustrates an environment in which a drain voltage application circuit applies a drain voltage via a drain probe to a sense transistor, in accordance with a first example in which the drain voltage application circuit uses a fixed high voltage source.

Referring to FIG. 4, the on drain voltage and the off drain voltage depend on whether the transistor is on or off. In one embodiment, the on drain voltage and the off drain voltage are applied using a circuit connected to the drain probe. FIG. 6 illustrates an environment 600 in which a drain voltage application circuit 610 applies a drain voltage via a drain probe 611 to the drain terminal 621 of a sense transistor 602. The sense transistor 602 may be, for example, the sense transistor 202 of FIG. 2. The drain probe 611 is represented symbolically as a circle and may be, for instance, one of the probes in the probe set 131 of FIG. 1. As an example, the drain voltage application circuit 610 may be situated within the mobile portion 121 of the wafer probe apparatus 120 of FIG. 2. Although not shown, the gate probe may be applied to the gate terminal 622 of the sense transistor 602 for application of the on gate voltage and the off gate voltage, and the source probe may be applied to the source terminal 623 of the sense transistor 602 for application of the on source voltage (e.g., ground) and the off source voltage (e.g., also ground).

The drain voltage application circuit 610 includes a resistor 612 connected in series between a first voltage source 613 and the drain probe 611. Furthermore, an inductor 614 is coupled in series between a second voltage source 615 and the drain probe 611. A first diode 616 is connected in series between the inductor 614 and the drain probe 611 and has a forward direction from the inductor 614 to the drain probe 611. A second diode 617 is connected between both ends of the inductor 614 and has a forward direction towards the second voltage source 615. The first voltage source 613 provides a higher voltage than the second voltage source 615. As an example, the first voltage source 613 may provide a relatively fixed voltage such as 400 volts, whereas the second voltage source 615 may provide a relatively fixed voltage of 6 volts.

When the sense transistor 602 is on, current passes from the first voltage source 613 through the resistor 612 and through the transistor 602. The resistor 612 has a high resistance value such that even though the first voltage source 613 provides a high voltage, the voltage at the drain probe 611 is low enough that the diode 616 is forward biased so as to allow current to flow from the second voltage source 615, through the inductor 614, through the diode 616 and through the transistor 602. Thus, when the sense transistor 602 is on, current passes through the sense transistor from the first voltage source 613 through the resistor 612, and from the second voltage source 615 through the inductor 614 and diode 616.

In one embodiment, the resistor 612 is large enough that the bulk of the current passing through the sense transistor 602 comes from the second voltage source 615 through the inductor 614 and diode 616. In that case, the amount of current passing through the sense transistor 602 (when the sense transistor 602 is on) may be approximated by measuring the amount of current passing through the inductor 614. In any case, the on drain voltage is quite low (e.g., in the single digits of volts) when the sense transistor 602 is on.

When the sense transistor 602 is off, the parasitic capacitance at the drain terminal 621 of the sense transistor 602 charges up until there is no more current flowing from the first voltage source 613, and the entire voltage provided by the first voltage source 613 is applied via the drain probe 611 to the drain terminal 621 of the sense transistor 602. For instance, if the first voltage source 613 provides 400 volts, that 400 volts is present at the drain terminal 621 of the sense transistor 602. In this case, the diode 616 is reversed-biased, and current circulates around the inductor 614 and a forward-biased diode 617. This circulating current allows current to be quickly applied again through the diode 616 the next time the sense transistor 602 turns on.

Figure 7:
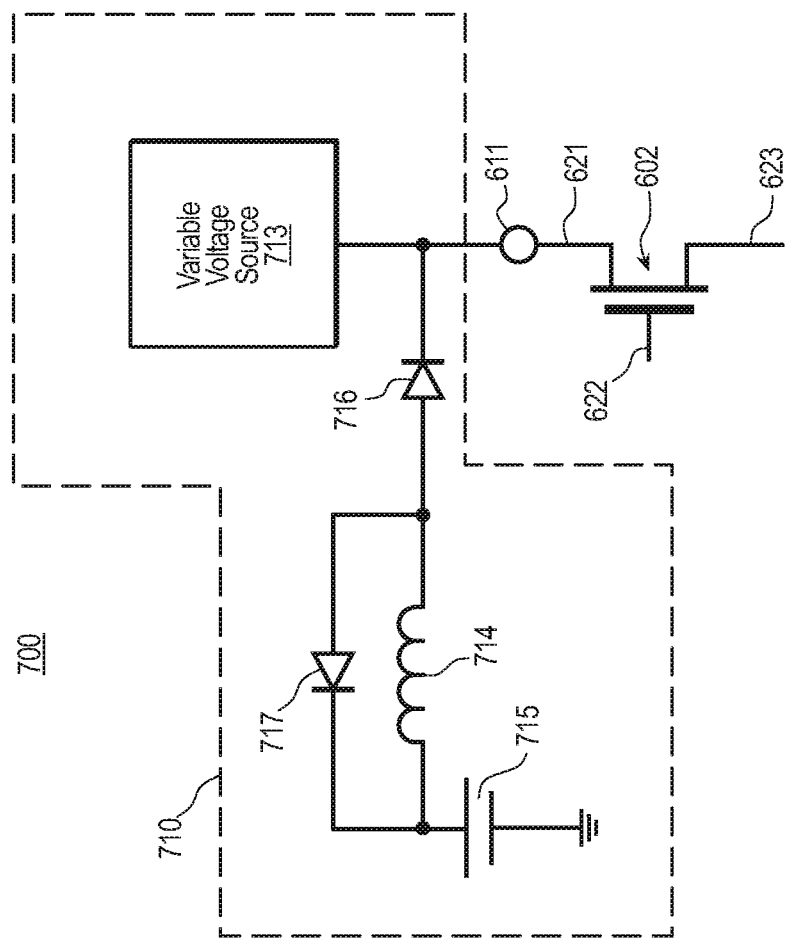
FIG. 7 illustrates an environment in which a drain voltage application circuit applies a drain voltage via a drain probe to a sense transistor, in accordance with a second example in which the drain voltage application circuit uses a variable or selective high voltage source.

FIG. 7 illustrates an environment 700 in which a drain voltage application circuit 710 applies a drain voltage via a drain probe 611 to the drain terminal 621 of the sense transistor 602. The drain voltage application circuit 710 of FIG. 7 has some similarities with the drain voltage application circuit 610 of FIG. 6. However, the first voltage source 613 and resistor 612 are replaced by a voltage source 713 that selectively applies a different voltage, depending on whether the sense transistor is on or off.

The drain voltage application circuit 710 includes an inductor 714 coupled in series between a second voltage source 715 and the drain probe 611. A first diode 716 is connected in series between the inductor 714 and the drain probe 611 and has a forward direction from the inductor 714 to the drain probe 611. A second diode 717 is connected between both ends of the inductor 714 and has a forward direction towards the second voltage source 715. The maximum voltage of the first voltage source 713 is greater than the voltage provided by the second voltage source 715. As an example, the first voltage source 713 may provide 400 volts when the transistor 602 is off, but a low voltage (such that the diode 716 is forward biased) when the transistor 602 is on. Accordingly, the drain voltage application circuit 710 operates similar to how the drain voltage application circuit 610 operates, except for how the low voltage is applied when the sense transistor 602 is on sufficient that the diode is forward biased.

Accordingly, a method and circuit for wafer testing a current property of a power transistor is described. Because the current property of a smaller sense transistor is measured, and the current property of the power transistor is determined based on the current property of the smaller sense transistor, the amount of current that passes through the drain probe is small and thus can be applied via the drain probe. Furthermore, as the active regions of the power transistor and sense transistor are formed of the same epitaxial stack, the sense transistor behaves similar to the power transistor but at a smaller scale, and thus the sense transistor is a good scaled-down proxy for the power transistor. Furthermore, by application of pre-conditioning to the sense transistor, the sense transistor may be stressed appropriately to simulate the same conditions that may be encountered by the power transistor during operation. Furthermore, heat may be applied to also simulate the same conditions that may be encountered by the power transistor during operation. Thus, accurate wafer testing for current properties of a power transistor may be performed prior to dicing of the wafer.

Literal Support Section

Clause 1. A method for determining a current property of a power transistor while the power transistor is still on a wafer, the method comprising: applying a first probe, a drain probe, to a drain terminal of a sense transistor that shares a drain node with the power terminal, the sense transistor being constructed using at least part of the same epitaxial stack as was used to construct which the power transistor, the sense transistor having a lower current flow area than the power transistor; applying a second probe, a source probe, to a source terminal of the sense transistor; applying a third probe, a gate probe, to a gate terminal of the sense transistor; pre-conditioning the sense transistor by alternate turning on and off the sense transistor multiple cycles while allowing a source terminal of the power transistor to float, wherein turning on the sense transistor comprises 1) applying an on gate voltage via the gate probe to the gate terminal of the sense transistor, 2) applying an on drain voltage via the drain probe to the drain terminal of the sense transistor, and 3) applying an on source voltage via the second probe to the source terminal of the sense transistor; wherein turning off the sense transistor comprises 1) applying an off gate voltage via the gate probe to the gate terminal of the sense transistor, 2) applying an off drain voltage via the drain probe to the drain terminal of the sense transistor, the off drain voltage greater than the on drain voltage, and 3) applying an off source voltage via the second probe to the source terminal of the sense transistor. after pre-conditioning the sense transistor, turning on the sense transistor and measuring at least one of 1) the current passing through the sense transistor from the drain terminal of the sense transistor to the source terminal of the sense transistor as the current increases, and 2) a drain-source voltage between the drain terminal of the sense transistor and the source terminal of the sense transistor as the drain-source voltage increases; and determining a current property of the power transistor based on the measurement.

Clause 2. The method in accordance with Clause 1, the current property comprising a current at which the current exits a linear region by a particular amount.

Clause 3. The method in accordance with Clause 1, the current property comprising a saturation current.

Clause 4. The method in accordance with Clause 1, the current property comprising a current slope verses time when operating in a linear region.

Clause 5. The method in accordance with Clause 1, the power transistor having a Gallium Nitride (GaN) channel layer, the sense transistor also having a GaN channel layer formed of a same epitaxial layer as the GaN channel layer of the power transistor.

Clause 6. The method in accordance with Clause 1, a current flow area of the power transistor being at least 100 times a current flow area of the sense transistor.

Clause 7. The method in accordance with Clause 1, a current flow area of the power transistor being at least 1000 times a current flow area of the sense transistor.

Clause 8. The method in accordance with Clause 1, each cycle being repeated at a rate of at least 10,000 per second.

Clause 9. The method in accordance with Clause 1, the measure comprising measuring both of 1) the current passing through the sense transistor from the drain terminal of the sense transistor to the source terminal of the sense transistor as the current increases, and 2) a drain-source voltage between the drain terminal of the sense transistor and the source terminal of the sense transistor as the drain-source voltage increases.

Clause 10. The method in accordance with Clause 1, the multiple cycles comprises at least twenty cycles.

Clause 11. The method in accordance with Clause 1, the off source voltage and the on source voltage both being the same.

Clause 12. The method in accordance with Clause 1, the off source voltage and the on source voltage both being ground.

Clause 13. The method in accordance with Clause 1, the on drain voltage and the off drain voltage being applied during the pre-conditioning using a circuit connected to the drain probe.

Clause 14. The method in accordance with Clause 13, the circuit comprising: a resistor connected in series between a first voltage source and the drain probe; an inductor coupled in series between a second voltage source and the drain probe; a first diode that is connected in series between the inductor and the drain probe and that has a forward direction from the inductor to the drain probe; and a second diode that is connected between the both ends of the inductor and that has a forward direction towards the second voltage source; a maximum voltage of the first voltage source being higher than a maximum voltage of the first voltage source.

Clause 15. The method in accordance with Clause 14, the first voltage source providing a fixed voltage.

Clause 16. The method in accordance with Clause 14, the first voltage source providing a first voltage when the transistor is off, and a second voltage when the power transistor is on, the first voltage being higher than the second voltage.

Clause 17. The method in accordance with Clause 13, the circuit comprising: a first voltage source providing a first voltage when the transistor is off, and a second voltage when the power transistor is on, the first voltage being higher than the second voltage. an inductor coupled in series between a second voltage source and the drain probe, the second voltage source providing a higher voltage; a first diode that is connected in series between the inductor and the drain probe and that has a forward direction from the inductor to the drain probe; and a second diode that is connected between both ends of the inductor and that has a forward direction towards the second voltage source; a maximum voltage of the first voltage source being higher than a maximum voltage of the first voltage source.

Although the subject matter has been described in language specific to structural features and/or methodological acts, it is to be understood that the subject matter defined in the appended claims is not necessarily limited to the described features or acts described above, or the order of the acts described above. Rather, the described features and acts are disclosed as example forms of implementing the claims.

The present disclosure may be embodied in other specific forms without departing from its essential characteristics. The described embodiments are to be considered in all respects only as illustrative and not restrictive. All changes which come within the meaning and range of equivalency of the claims are to be embraced within their scope.

When introducing elements in the appended claims, the articles "a," "an," "the," and "said" are intended to mean there are one or more of the elements. The terms "comprising," "including," and "having" are intended to be inclusive and mean that there may be additional elements other than the listed elements.

What is claimed:

1. A method for determining a current property of a power transistor while the power transistor is still on a wafer, the method comprising:
    applying a first probe, a drain probe, to a drain terminal of a sense transistor that shares a drain node with the power terminal, the sense transistor being constructed using at least part of a same epitaxial stack as was used to construct which the power transistor, the sense transistor having a lower current flow area than the power transistor;
    applying a second probe, a source probe, to a source terminal of the sense transistor;
    applying a third probe, a gate probe, to a gate terminal of the sense transistor;
    pre-conditioning the sense transistor by alternate turning on and off the sense transistor multiple cycles while allowing a source terminal of the power transistor to float,
        wherein turning on the sense transistor comprises 1) applying an on gate voltage via the gate probe to the gate terminal of the sense transistor, 2) applying an on drain voltage via the drain probe to the drain terminal of the sense transistor, and 3) applying an on source voltage via the second probe to the source terminal of the sense transistor;
        wherein turning off the sense transistor comprises 1) applying an off gate voltage via the gate probe to the gate terminal of the sense transistor, 2) applying an off drain voltage via the drain probe to the drain terminal of the sense transistor, the off drain voltage greater than the on drain voltage, and 3) applying an off source voltage via the second probe to the source terminal of the sense transistor;
    after pre-conditioning the sense transistor, turning on the sense transistor and measuring at least one of 1) the current passing through the sense transistor from the drain terminal of the sense transistor to the source terminal of the sense transistor as the current increases, and 2) a drain-source voltage between the drain terminal of the sense transistor and the source terminal of the sense transistor as the drain-source voltage increases; and determining a current property of the power transistor based on the measurement.

2. The method in accordance with claim 1, the current property comprising a current at which the current exits a linear region by a particular amount.

3. The method in accordance with claim 1, the current property comprising a saturation current.

4. The method in accordance with claim 1, the current property comprising a current slope verses time when operating in a linear region.

5. The method in accordance with claim 1, the power transistor having a Gallium Nitride (GaN) channel layer, the sense transistor also having a GaN channel layer formed of the same epitaxial layer as the GaN channel layer of the power transistor.

6. The method in accordance with claim 1, a current flow area of the power transistor being at least 100 times a current flow area of the sense transistor.

7. The method in accordance with claim 1, a current flow area of the power transistor being at least 1000 times a current flow area of the sense transistor.

8. The method in accordance with claim 1, each cycle being repeated at a rate of at least 10,000 per second.

9. The method in accordance with claim 1, the measure comprising measuring both of 1) the current passing through the sense transistor from the drain terminal of the sense transistor to the source terminal of the sense transistor as the current increases, and 2) a drain-source voltage between the drain terminal of the sense transistor and the source terminal of the sense transistor as the drain-source voltage increases.

10. The method in accordance with claim 1, the multiple cycles comprises at least twenty cycles.

11. The method in accordance with claim 1, the off source voltage and the on source voltage both being the same.

12. The method in accordance with claim 1, the off source voltage and the on source voltage both being ground.

13. The method in accordance with claim 1, the on drain voltage and the off drain voltage being applied during the pre-conditioning using a circuit connected to the drain probe.

14. The method in accordance with claim 13, the circuit comprising:
a resistor connected in series between a first voltage source and the drain probe;
an inductor coupled in series between a second voltage source and the drain probe;
a first diode that is connected in series between the inductor and the drain probe and that has a forward direction from the inductor to the drain probe; and
a second diode that is connected between the both ends of the inductor and that has a forward direction towards the second voltage source; a maximum voltage of the first voltage source being higher than a maximum voltage of the first voltage source.

15. The method in accordance with claim 14, the first voltage source providing a fixed voltage.

16. The method in accordance with claim 14, the first voltage source providing a first voltage when the transistor is off, and a second voltage when the power transistor is on, the first voltage being higher than the second voltage.

17. The method in accordance with claim 13, the circuit comprising:
a first voltage source providing a first voltage when the transistor is off, and a second voltage when the power transistor is on, the first voltage being higher than the second voltage;
an inductor coupled in series between a second voltage source and the drain probe, the second voltage source providing a higher voltage;
a first diode that is connected in series between the inductor and the drain probe and that has a forward direction from the inductor to the drain probe; and
a second diode that is connected between both ends of the inductor and that has a forward direction towards the second voltage source; a maximum voltage of the first voltage source being higher than a maximum voltage of the first voltage source.

\* \* \* \* \*